United States Patent [19]

Miyamoto et al.

[11] Patent Number: 5,109,317
[45] Date of Patent: Apr. 28, 1992

[54] MOUNTING MECHANISM FOR MOUNTING HEAT SINK ON MULTI-CHIP MODULE

[75] Inventors: Mitsuo Miyamoto; Shizuo Zushi, both of Hadano; Hiroshi Go, Zama; Fumiyuki Kobayashi, Sagamihara; Hiroyuki Kojima, Ushiku, all of Japan

[73] Assignee: Hitachi, Ltd., Tokyo, Japan

[21] Appl. No.: 604,953

[22] Filed: Oct. 29, 1990

[30] Foreign Application Priority Data

Nov. 7, 1989 [JP] Japan .................. 1-287926

[51] Int. Cl.⁵ .................................. H05K 7/20
[52] U.S. Cl. ..................... 361/386; 357/81; 361/387; 165/80.3
[58] Field of Search .......... 174/16.3; 357/79, 81, 357/82; 165/80.3, 185, 104.33; 361/385–389, 405, 382, 417, 419, 420, 383; 363/141

[56] References Cited

U.S. PATENT DOCUMENTS

| | | |
|---|---|---|
| 3,946,276 | 3/1976 | Braun ........................ 361/386 |
| 4,115,836 | 9/1978 | Hutchinson ................. 361/386 |
| 4,235,283 | 11/1980 | Gupta ........................ 361/386 |
| 4,342,068 | 7/1982 | Kling ......................... 361/386 |
| 4,563,725 | 1/1986 | Kirby ......................... 361/388 |
| 4,612,601 | 9/1986 | Watari ....................... 361/387 |
| 4,653,828 | 8/1989 | Penn .......................... 361/386 |
| 4,833,567 | 5/1989 | Saaski ........................ 361/385 |
| 4,935,864 | 6/1990 | Schmidt ..................... 363/141 |

FOREIGN PATENT DOCUMENTS 60-143653 7/1985 Japan .

Primary Examiner—Gerald P. Tolin
Attorney, Agent, or Firm—Kenyon & Kenyon

[57] ABSTRACT

A cooling structure for cooling a multi-chip module by a heat sink is disclosed in which the heat sink is disposed above the multi-chip module in a state that heat-conductive grease is sandwiched between the heat sink and the module cap of the multi-chip module, and the heat sink, the module cap and the wiring board of the multi-chip module are clamped as one body by clamp member, and in which a heat-sink pushing member for pressing the heat sink against the module cap by a constant force is attached to the clamp members.

9 Claims, 3 Drawing Sheets

MOUNTING MECHANISM FOR MOUNTING HEAT SINK ON MULTI-CHIP MODULE

BACKGROUND OF THE INVENTION

The present invention relates to a mechanism for mounting a heat sink on a multi-chip module.

A multi-chip module which includes a plurality of chips at a high packing density, generally produces a large amount of heat. Accordingly, it is necessary to cool the multi-chip module by some means. Usually, a heat sink is mounted on a module cap with the aid of a screw or the like, to cool the module.

A related art with respect to the structure of the multi-chip module provided with the heat sink is disclosed in, for example, JP-A-60-143,653. This art, however, fails to show how to attach the heat sink to the module. A structure for mounting a heat sink on a multi-chip module, has not yet been established.

Further, another Japanese patent application (Appln. No. Hei 1-101,771) filed by the present assignee, is not which prior art to the present invention discloses a heat sink but does not show how to mount a heat sink on a module.

As mentioned above, a favorable structure for mounting a heat sink on a module, has not yet been established. When the heat sink is bonded to the module by a screw, there arises a problem that the cap plate of the module is required to have thickness greater than a predetermined value. Further, the heat sink is fixed to the cap plate at a plurality of positions by screws, and it is difficult to generate the same fixing force at the above positions. Thus, there arises another problem that it is difficult to surely maintain heat-conductive grease between the heat sink and the cap plate, and to prevent air from being mixed with the grease.

In order to improve the operation speed and reliability of a semiconductor device, it is necessary to make the heat resistance between a heat sink and a module cap, as small as possible. Thus, grease which is high in thermal conductivity, is typically inserted between the module cap and the heat sink. Further, a mechanism for mounting the heat sink on a module is required to allow the deformation of each of the heat sink and the module and variations in dimensions of each of the heat sink and the module. Specifically, in a case where the module cap is made of ceramics having high thermal conductivity such as aluminum nitride, it is difficult to perform a thread-cutting operation for the module cap. Even if the thread-cutting operation can be performed, a crack will readily generate in the module cap at a time the heat sink is fixed to the cap by a screw.

SUMMARY OF THE INVENTION

The present invention provides a mechanism for mounting a heat sink on a multi-chip module, which mechanism can solve the problems of the prior art, can surely maintain heat-conductive grease between the heat sink and the module for a long time, can follow the external force applied to the heat sink, the pressure of cooling liquid and the thermal expansion of the module, and can allow variations in thickness of the structure made up of the heat sink and the module and a change in thickness of the abovementioned structure due to heat.

The present invention also provides a mechanism for mounting a heat sink on a multi-chip module, which mechanism has a locking part for locking the mechanism to a carrier which is used for carrying the module, and a jig which is used for detaching the module from an electronic device, and can prevent a tension from being applied to the sealing solder between a module cap and a wiring board.

According to an embodiment of the present invention, the heat sink, the module cap and the wiring board are clamped, as one body, by a clamp member, and the heat sink is pressed against the module cap at a central portion thereof by a spring or the like.

Further according to the present invention, a groove is provided in the clamp member, to lock the clamp member to the carrier which is used for carrying the module, and the jig which is used for detaching the module from the electronic device.

As mentioned above, to fix the heat sink to the module and to press the heat-conductive grease between the heat sink and the module, according to the present invention, the heat sink, the module cap and the wiring board are clamped, as one body, by the clamp member so that a load is applied to a central portion of the module cap. Thus, the heat-conductive grease can be surely maintained between the heat sink and the module cap. Moreover, the above structure can follow the thermal deformation of each of the module cap and the heat sink. Further, the sealing solder between the module cap and the wiring board is always applied with a compressive load, with which it is difficult to destroy the solder. Thus, highly reliable sealing can be obtained.

Further, the clamp member has a groove for locking the clamp member to the carrier which is used for carrying the module, and the jig which is used for detaching the module from the electronic device. Thus, the module can be readily carried, and can be attached to and detached from the electronic device.

DETAILED DESCRIPTION

Now, embodiments of the present invention will be explained below in detail, with reference to the drawings.

Figure 1:
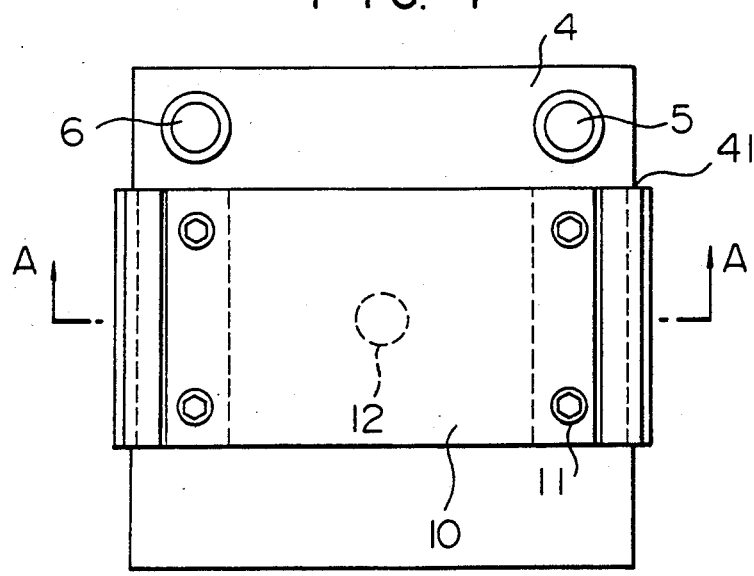
FIG. 1 is a plan view showing an embodiment of a mechanism for mounting a heat sink on a module in accordance with the present invention.
Figure 2A:
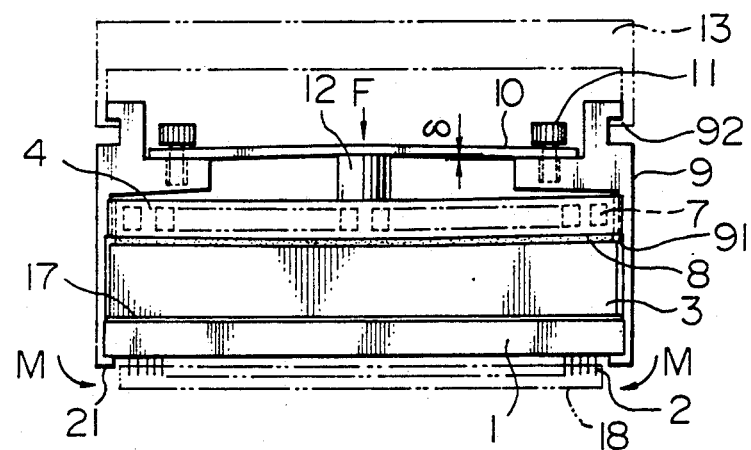
FIG. 2A is a front view showing the embodiment of FIG. 1.
Figure 2B:
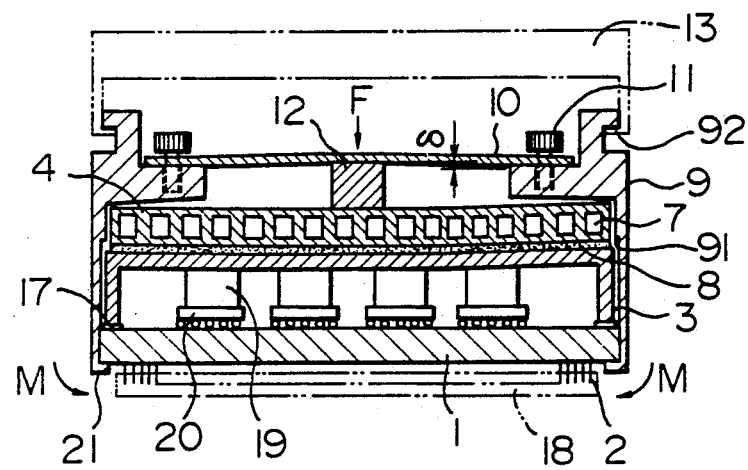
FIG. 2B is a sectional view taken along the line A—A of FIG. 1.

FIG. 1 is a plan view showing an embodiment of a mechanism for mounting a heat sink on a module in accordance with the present invention, FIG. 2A is a front view showing the embodiment, and FIG. 2B is a sectional view taken along the line A—A of FIG. 1. In FIGS. 1, 2A and 2B, reference numeral 1 designates a wiring board, 2 a pin, 3 a module cap, 4 a heat sink, 5 a coolant inlet, 6 a coolant outlet, 7 a coolant path, 8 heat-conductive grease, 9 a clamp member, 10 a plate spring, 11 a bolt, 12 a spacer, 13 a carrier, 17 solder, 41 a notch, 91 a protrusion, 92 a locking groove, 19 a thermal conductor, and 20 a heat-generating electronic part such as an LSI.

Referring to FIGS. 1, 2A and 2B, the module cap 3 is bonded to the wiring board 1 by solder 17, and the wiring board 1 is mounted with an LSI or the like. The module cap 3 is made of a material, high in thermal conductivity such as aluminum nitride, and heat-generating electronic parts such as an LSI are included in a hermetically-sealed vessel which is formed of the module cap 3 and the wiring board 1.

The heat sink 4 is pressed against the module cap 3 through the heat-conductive grease 8 by the plate spring 10 and the heat-sink pushing spacer 12.

Heat generated by the inner electronic parts such as an LSI is conducted to the heat sink 4 through the thermal conductor 19, the module cap 3 and the heat-conductive grease 8, to be taken out. The coolant paths 7 are provided in the heat sink 4, and heat from the module cap is absorbed by cooling liquid, such as water or oil, which flows into the coolant inlet 5 and then flows through the coolant paths 7 to the coolant outlet 6. Thus, the generated heat can be taken out.

The heat sink 4 is relatively flexible. Hence, even when a relatively weak force is applied to the heat sink 4, the heat sink can be deformed. Further, even when a load is applied to the heat sink 4, the heat-conductive grease 8 can be maintained between the heat sink 4 and the module cap 3. In order to surely maintain the heat-conductive grease 8 on the whole of the upper surface of the module cap 3, it is desirable to press the whole of the heat sink 4 against the module cap 3 by a uniformly distributed load. Such a structure is not only complicated but also expensive.

As is apparent from the sectional view shown in FIG. 2B, according to the present embodiment, the wiring board 1, the module cap 3 and the heat sink 4 are clamped as one body, by means of the clamp members 9, the plate spring 10 and the heat-sink pushing spacer 12.

That is, according to the present embodiment, each of a pair of clamp members 9 has a pawl portion 21 for supporting the bottom of the wiring board 1, and extends from the bottom of the wiring board 1 to the upper surface of the heat sink 4. The clamp members 9 are coupled with each other on the heat-sink side in such a manner that the plate spring 10 is fixed to the clamp members 9 by bolts 11, and the heat-sink pushing spacer 12 is disposed between the heat sink 4 and a central portion of the plate spring 10. Thus, the heat sink 4, the module cap 3 and the wiring board 1 are all clamped, and the heat sink 4 is pressed against the module cap 3.

In the clamp mechanism made up of the abovementioned clamp members 9 and heat-sink pushing means which includes the plate spring 10 and the spacer 12, the positioning of each clamp member 9 is made by using the notch 41 of the heat sink 4 and the protrusion 91 of the clamp member 9.

Each clamp member 9 has a groove 92 for locking the clamp member to the carrier 13 which is used for carrying the module. The groove 92 is also used for locking the clamp member 9 to a jig for drawing out pins 2 from a connector 18. The pins 2 are used to transmit signals between the module and a device and to supply electric power to the module.

Figure 3:
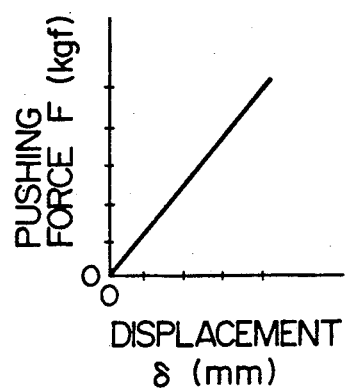
FIG. 3 is a graph showing the characteristic of a spring.

The plate spring 10 used in the present embodiment has a linear characteristic shown in FIG. 3. That is, the pushing force F of the plate spring 10 is proportional to the displacement 6 thereof. The displacement 6 is determined, by taking into consideration variations in height of the module, a change in height of the module due to the thermal deformation thereof, and the bending of the module due to the pressure of the cooling liquid.

When the plate spring 10 is pressed against the clamp members 9 by the threaded bolts 11, a moment of force is applied to that portion of each clamp member 9 which is kept in contact with the wiring board 1, as indicated by an arrow M in FIGS. 2A and 2B. Thus, the clamp members 9 can securely hold the wiring board 1.

According to the present embodiment, the heat sink 4 and the module are held as one body, in a state that the heat-conductive grease 8 is sandwiched between the heat sink 4 and the module cap 3. Thus, the heat resistance between the heat sink 4 and the module is kept at a low value, independently of the deformation of the structure made up of the module and the heat sink 4 due to an external force applied to the heat sink, the pressure of the cooling liquid, and heat, and independently of variations in thickness of the above structure. Further, variations in the above heat resistance can be made small. Thus, the reliability of the structure made up of the module and the heat sink can be improved.

Further, according to the present embodiment, it is easy to carry the module and to detach the module from a device. Moreover, the sealing application of tension to the solder between the module cap 3 and the wiring board 1 is prevented. Thus, the reliability of the sealing can be improved.

Figure 4:
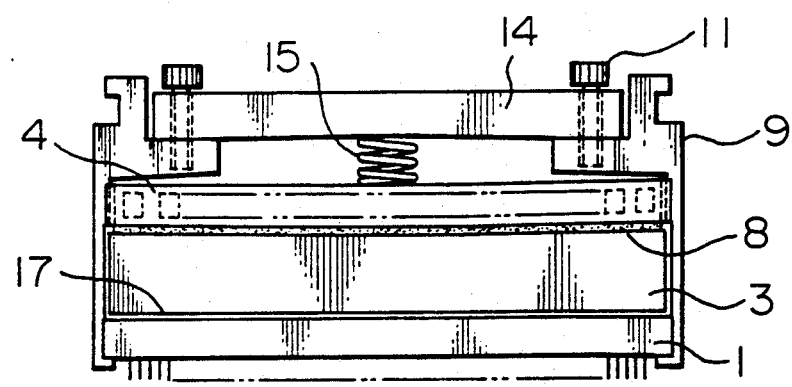
FIG. 4 is a front view showing another embodiment of a mechanism for mounting a heat sink on a module in accordance with the present invention.
Figure 5:
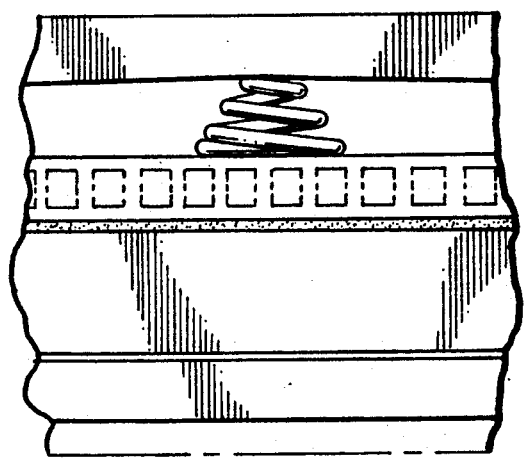
FIG. 5 is a front view showing another embodiment with a coned disc spring.

FIG. 4 is a front view showing another embodiment of a mechanism for mounting a heat sink on a module in accordance with the present invention. In FIG. 4, reference numeral 14 designates a supporting member, and 15 a coil spring. Further, other reference numerals in FIG. 4 designate the same parts as used in FIGS. 1, 2A and 2B.

The present embodiment is different from the embodiment of FIGS. 1, 2A and 2B in that heat-sink pushing means made up of the supporting member 14 and the coil spring 15 is substituted for the heat-sink pushing means made up of the plate spring 10 and the spacer 12.

Like the plate spring 10, the supporting member 14 according to the present embodiment is fixed to a pair of clamp members 9 by the threaded bolts 11. The coil spring 15 is disposed between the supporting member 14 and the heat sink 4, to push the heat sink 4.

Although the coil spring 15 is used in the present embodiment for the purpose of pushing the heat sink 4, various elastic members such as a coned disc spring can be used in place of the coil spring 15.

It is needless to say that the present embodiment can produce the same effect as obtained by the embodiment of FIGS. 1, 2A and 2B.

As has been explained in the foregoing, according to the present invention, the heat sink 4 and the module are held as one body in a state that the heat-conductive grease 8 is sandwiched between the heat sink 4 and the module cap 3.

Thus, the heat resistance between the heat sink 4 and the module is kept at a low value, independently of a deformation of the structure made up of the module and the heat sink 4, due to an external force applied to the heat sink, the pressure of the cooling liquid, and heat, and independently of variations in thickness of the above structure. Further, variations in the above heat resistance can be made small. Thus, the reliability of the structure made up of the module and the heat sink can be improved.

Further, according to the present invention, it is easy to carry the module and to detach the module from a device. Moreover, the application of tension to the sealing solder between the module cap 3 and the wiring board 1 is prevented. Thus, the reliability of sealing is improved.

What is claimed is:

1. A mounting mechanism mounting a heat sink on a multi-chip module which is made up of a wiring board and a cap fixed to the wiring board, in such a manner that heat-conductive grease is sandwiched between the heat sink and the cap, the mounting mechanism comprising a clamp holding a bottom surface of the wiring board and the upper surface of the heat sink, and pressing the heat sink to the cap by a resilient force;
    wherein the clamp includes,
    a pair of pawl portions holding opposites sides of the bottom surface of the wiring board;
    a connecting member connecting the pair of pawl portions, the connecting member being positioned above an upper surface of the heat sink, and
    means, extending from the connecting member and coming into contact with the central portion of the upper surface of the heat sink, for applying force to said central portion.

2. A mounting mechanism according to claim 1, wherein the connecting member includes a plate spring and the means extending includes a heat-sink pushing spacer.

3. A mounting mechanism according to claim 1, wherein the connecting member includes a supporting member and the means extending includes a coil spring placed between and in contact with said supporting member and the heat sink.

4. A mounting mechanism according to claim 1, wherein a groove is provided in the clamp to enable locking the clamp to a carrier which can be used for carrying the multi-chip module.

5. A mounting mechanism according to claim 1, wherein the cap is made of aluminum nitride.

6. A mounting mechanism according to claim 1, wherein the connecting member includes a supporting member and the means extending includes a coned disc spring.

7. A mounting mechanism according to claim 1, wherein a groove is provided in the clamp to enable locking the clamp to a jig which is used for detaching the multi-chip module from an electronic device.

8. A module structure comprising:
    a module including therein a heat-generating electronic part;
    a heat sink disposed above the module in a state that heat-conductive grease is sandwiched between the bottom surface of the heat-sink and the upper surface of the module; and
    heat-sink restraining means kept in contact with a central portion of the upper surface of the heat sink pressing the heat sink against the module by a resilient force;
    wherein the heat-sink restraining means includes,
    a pair of pawl portions holding opposite sides of the bottom surface of the module,
    connecting member connecting the pair of pawl portions, the connecting member being positioned above the upper surface of the heat sink, and
    means extending from the connecting member and coming into contact with the central portion of the upper surface of the heat sink for applying force to said central portion.

9. A module structure of claim 8 wherein the upper surface of the module is made of aluminum nitride.

* * * * *

UNITED STATES PATENT AND TRADEMARK OFFICE
CERTIFICATE OF CORRECTION

PATENT NO. : 5,109,317
DATED : April 28, 1992
INVENTOR(S) : Mitsuo Miyamoto et al It is certified that error appears in the above-indentified patent and that said Letters Patent is hereby corrected as shown below:

```
Column 1, line 21, after "assignee" insert --which--;
         line 22, delete "which"; after "invention" insert
         --,--.
Column 4, line 1, change "displacement 8" to --displacementδ --
(both occurrences).
Column 4, line 27, before "application" delete "sealing";
         line 28, before "solder" insert --sealing--.
```

Signed and Sealed this

Nineteenth Day of July, 1994

Attest:

BRUCE LEHMAN

*Attesting Officer*  *Commissioner of Patents and Trademarks*